United States Patent [19]

Asars et al.

[11] 4,110,664
[45] Aug. 29, 1978

[54] ELECTROLUMINESCENT BARGRAPH WITH INTEGRAL THIN-FILM TRANSISTOR CONTROL CIRCUITRY

[75] Inventors: Juris A. Asars, Murrysville; David H. Davies, Wilkins Township, Allegheny County; Thomas P. Brody, Pittsburgh, all of Pa.

[73] Assignee: Westinghouse Electric Corp., Pittsburgh, Pa.

[21] Appl. No.: 787,801

[22] Filed: Apr. 15, 1977

[51] Int. Cl.² ............ H05B 37/00; H05B 39/00; H05B 41/00
[52] U.S. Cl. .............. 315/169 TV; 340/166 EL
[58] Field of Search .......... 315/169 TV; 340/173 PL, 340/166 EL

[56] References Cited

U.S. PATENT DOCUMENTS

| | | | |
|---|---|---|---|
| 3,866,209 | 2/1975 | Weimer | 340/324 R |
| 4,006,383 | 2/1977 | Luo et al. | 315/169 TV |
| 4,042,854 | 8/1977 | Luo et al. | 315/169 TV |

OTHER PUBLICATIONS

Santoni, "Electronic Bar-Graph Displays", Electronics, pp. 114, 118, Jul. 22, 1976.
"A 6x6-in. 20/pi Electroluminescent Display Panel", IEEE Transactions on Electron Devices, vol. ED-22, No. 7, p. 739, 1975.

Primary Examiner—Alfred E. Smith
Assistant Examiner—Robert E. Wise
Attorney, Agent, or Firm—W. G. Sutcliff

[57] ABSTRACT

An electroluminescent bargraph display module is detailed with an integral multi-stage thin-film transistor dynamic shift register disposed upon the module substrate side-by-side with the individually controllable electroluminescent display elements. The shift register accepts serial digital data input and holds it stationary in the register and supplies parallel outputs from the respective stages which are connected to individual display elements.

6 Claims, 8 Drawing Figures

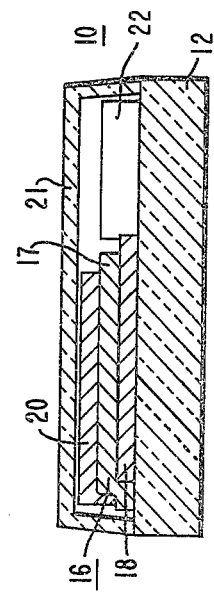
FIG. IB
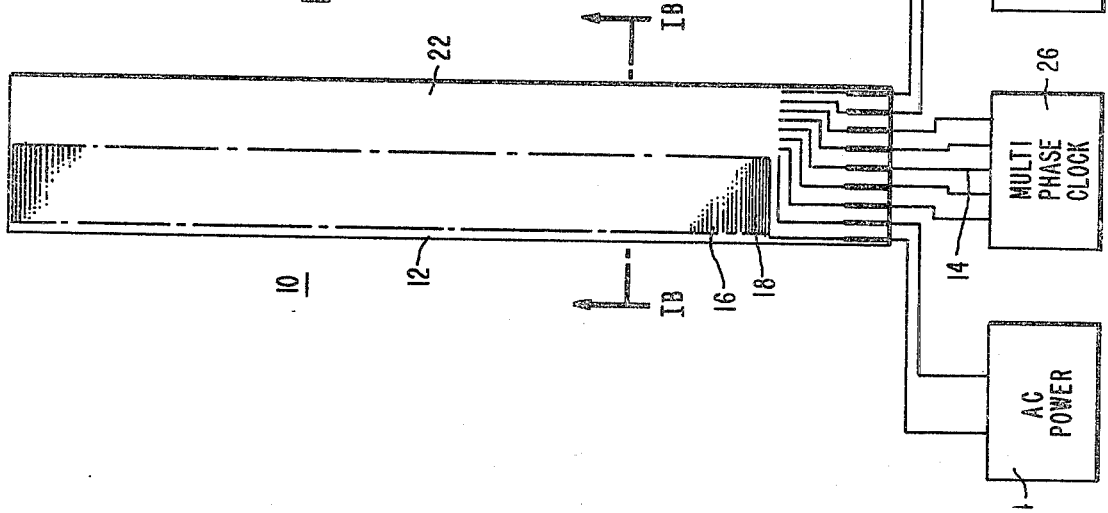
FIG. IA

ELECTROLUMINESCENT BARGRAPH WITH INTEGRAL THIN-FILM TRANSISTOR CONTROL CIRCUITRY

BACKGROUND OF THE INVENTION

A bargraph display is an instrumentation indicator which has distinct advantages over digital and mechanical analog panel meters in many applications. As an analog meter the bargraph is easy to quickly and accurately interpret and to scan for trend or comparison information.

Electronic bargraphs presently on the market include light emitting diode (LED) displays, incandescent displays, liquid crystal displays, and gas discharge displays. Each of these bargraphs has its own advantages and disadvantages, which deal mainly with power consumption, operating environment considerations, brightness, ease of interfacing with electronic drive circuitry. Most such devices suffer from relatively small display areas and from inability to operate in a wide range of environmental conditions.

The use of electroluminescent flat panel displays integrated with thin-film transistor control circuitry is taught by U.S. Pat. No. 4,006,383. Such devices are particularly useful for displaying alpha-numeric information. The electroluminescent (EL) display element is made part of a relatively simple thin-film transistor control circuit which is associated with each individual display element.

It is desirable to design and fabricate an electronic bargraph which is capable of an analog display appearance and high resolution. The display medium should have rapid response, high brightness, be environmentally rugged, and easily integrated with the electronic drive circuitry. The electronic drive circuitry should be integratable with the display elements and give reliable and flexible operating capability to the system.

SUMMARY OF THE INVENTION

An electroluminescent bargraph display system is detailed which includes on a unitary substrate a plurality of discrete, individually controllable adjacent electroluminescent display elements interconnected to a thin-film transistor dynamic shift register. Individual stages of the shift register are connected to individual display elements. The shift register is addressed as peripheral input buses which are connectable to external drive systems. The shift register accepts serial digital data input and converts it to parallel output signals which control the individual electroluminescent display elements.

A novel thin-film transistor shift register circuit has been designed for this application, and permits hold and refresh operation of the display panel.

BRIEF DESCRIPTION OF THE DRAWINGS

FIG. 1A is a schematic representation of the bargraph display device of the present invention.

FIG. 1B is a cross sectional representation taken along line 1B—1B of FIG. 1A.

DESCRIPTION OF THE PREFERRED EMBODIMENTS

Figure 2:
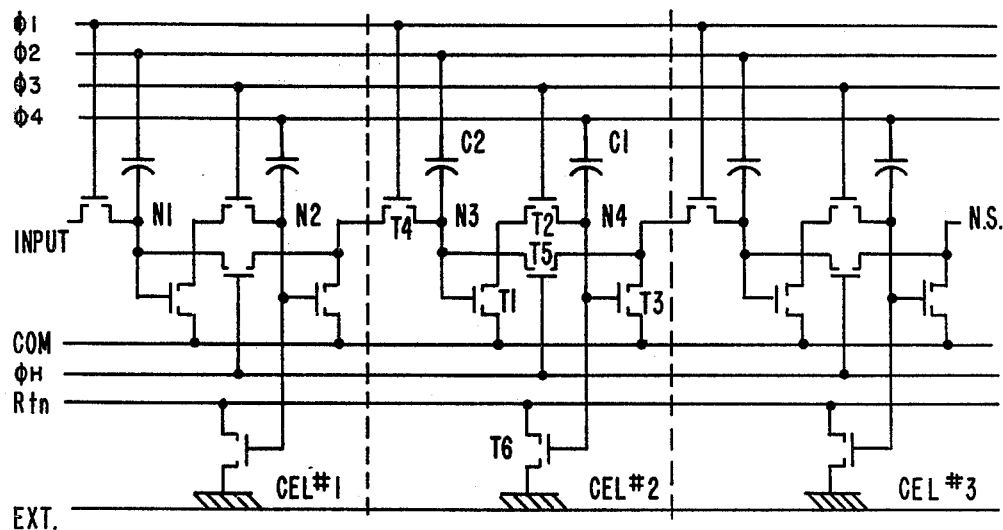
FIG. 2 is a partial circuit schematic of three stages of the thin-film transistor dynamic shift register showing its interconnection to three electroluminescent display elements.

The electroluminescent bargraph display panel 10 is seen in the plan representation of FIG. 1A and the cross section of FIG. 1B. The panel 10 comprises an elongated rectangular insulative substrate 12. A plurality of metal film deposited bus leads 14 are disposed at one peripheral side, preferably at one of the short sides of the panel. A plurality of electroluminescent (EL) display elements 16 which are thin stripe-like elements are disposed on the substrate aligned side-by-side extending part way across the substrate. The electroluminescent (EL) display elements comprise a bottom electrode 18 which is a thin metal strip. These electrodes 18 are spaced apart, and the electroluminescent phosphor 17 is disposed over the electrodes, either as finely divided powder or as a thin film of EL material. Common, light transmissive front electrode 20 covers the entire area above the EL phosphor 17 and the electrodes 18. An insulating light transmissive cover layer 21 may be provided over the top electrode 20 and the shift register 22.

A dynamic shift register 22 is disposed on the substrate 12 alongside the display elements 16 along the length of the panel. The shift register is seen in greater detail in FIG. 2, and its interconnection with the peripheral bus leads 14 as well as with the EL display elements 16 is seen. Only three stages of the dynamic shift register 22 are shown, but it is understood there is a stage for each EL display element. By way of example, a 200 element bar graph giving 0.5% resolution can be provided on a 116.5 mm by 27.4 mm insulating substrate. The electroluminescent elements are 12.4 mm wide and the shift register about 6.7 mm wide, with the shift register stages being repeated about every 0.49 mm.

The peripheral leads 14 connect the thin film circuit elements as seen in FIG. 2 with the external drive system, which in FIG. 1 is seen as an AC power supply 24 which is connected to display element electrode 20 and to one contact of switching transistor T6 at each stage of the shift register, the other contact of T6 being connected to the individual display element electrodes 16. The multiphase clock 26 provides the exemplary clock phase pulses $\phi1$, $\phi2$, $\phi3$, $\phi4$, and $\phi H$. The analog-to-digital (A/D) converter 28 provides the digital information drive signal which is the input to the shift register and the common reference signal. This A/D converter 28 is connected to an analog signal sensor such as a voltmeter, thermocouple or the like.

Figure 3:
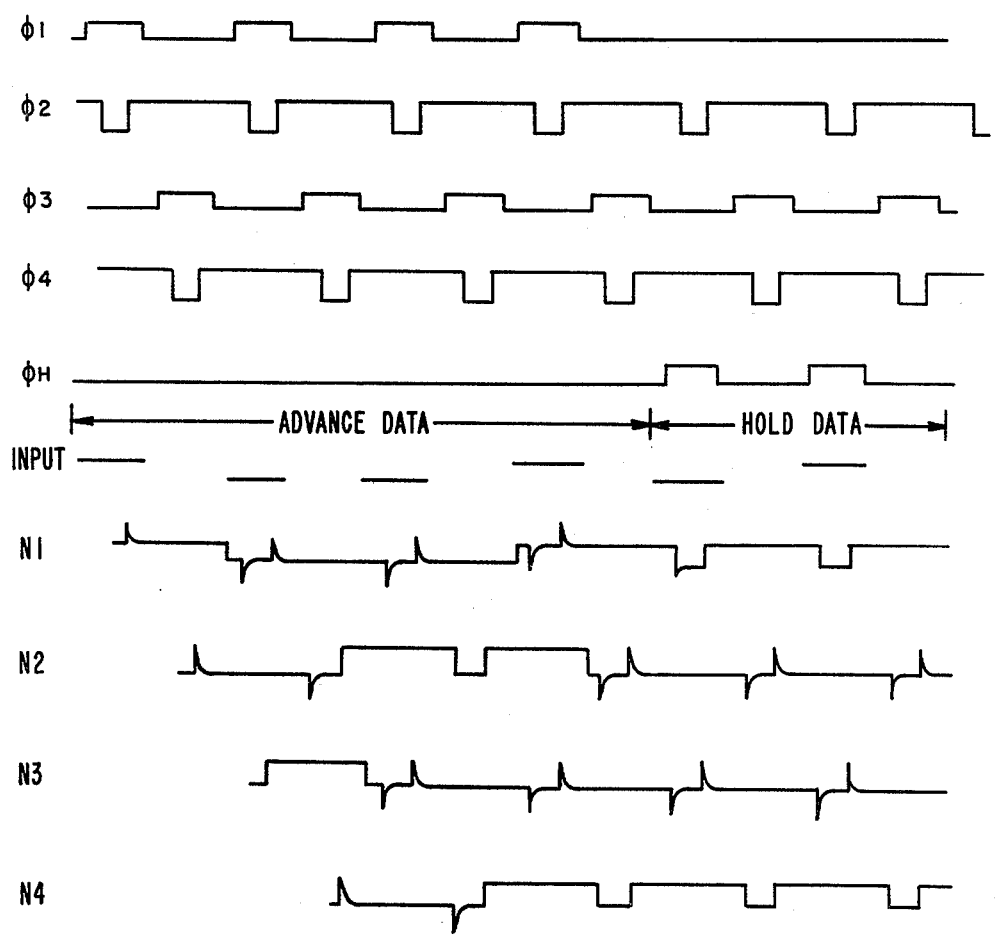
FIG. 3 is a plot of the operating waveforms which are present during operation of the circuit of FIG. 2.

In FIG. 2, the left end of the circuit schematic represents the peripheral lead-ins 16 seen in FIG. 1, and the four leads $\phi1$, $\phi2$, $\phi3$, $\phi4$ are connected to an external clock means, not shown, which supplies sequential timing pulse waveforms as indicated in FIG. 3. A single stage of the dynamic shift register is indicated by the dotted line in FIG. 2, and each stage comprises thin-film insulated gate field effect transistors T1, T2, T3, T4, T5, and T6, and the storage capacitors C1 and C2. The node points N1 and N2 associated with one stage and node points N3 and N4 associated with the adjacent stage will be referred to below in the operating description.

One contact of transistor T4 is connected to the digital input signal lead while the other contact of T4 is connected to storage capacitor C2 and to the gate of transistor T1. The gate of T4 is connected to clock input $\phi$1, and the other side of capacitor C2 is connected to clock input $\phi$2. Node input N1 is defined in the line connecting the gate of T1, the contact of T4 and C2. One contact of T1 is connected to a common bus, while the other contact is connected to one contact of transistor T2. The gate of T2 is connected to clock input $\phi$3, and the other contact of T2 is connected to capacitor C1 and the gates of transistors T3 and T6. One contact of T3 is connected to the common bus, and the other contact is connected as the input to the next stage. Transistor T6 is actually an isolation switching device, which is turned off and on by the stage output signal. One of the contacts of T6 is connected to the individual display element electrode 18 and the other contact is connected to a return bus which is connected to the power supply which is also connected to the common front electrode 20. The transistor T5 is connected within a given stage between a first and second half stage as a hold and refresh means, with the contacts connected between node N3 and the output side contact of T3. The gate of T5 is connected to a hold clock pulse lead $\phi$H.

OPERATING DESCRIPTION

A dynamic shift register stage is associated with and controls each electroluminescent light emitting bar of the bargraph display device. Information in the form of "1's" and "0's" is serially shifted into this register during a sampling or load period and then held in a stationary position during a hold and display period. Three stages of the bargraph shift register and the associated electroluminescent display elements are illustrated in FIG. 2. FIG. 3 illustrates both the externally applied and the internal node potential-time waveforms for these three stages. Five n-type thin-film insulated gate field effect transistors T1 through T5, and two node capacitors C1 and C2, shown between the two dotted lines in FIG. 2 constitute one stage of the shift register. A control transistor T6 and an electroluminescent cell or capacitor CEL are associated with each stage of the thin-film shift register. During the shift register load period positive and negative pulses are applied to its clock inputs $\phi$1, $\phi$2, $\phi$3 and $\phi$4 as indicated at the top of FIG. 3. Clock input $\phi$H is held at zero with respect to the common terminal (Com), and the electroluminescent excitation signal is absent. The serial input data is in the form of low ("1", bright electroluminescent element) and high ("0", dark electroluminescent element) potential levels and must be valid during the positive $\phi$1 pulse which renders transistor T4 conductive and connects the first node N1 of the first shift register stage to the input terminal. The potential at this typical first stage node during the load period is directly determined by the input signal, and the negative $\phi$2 clock pulse produces only short-lived transients. After the termination of the positive $\phi$1 pulse the input potential remains stored at node N1 and determines the conductivity of transistor T1 during the second half of the first clock cycle. The second half of the clock cycle is initiated by a positive $\phi$3 pulse which renders transistor T3 conductive. Independent of its previous level, the potential at node N2 is forced to approach the common terminal (Com.) potential during the negative $\phi$4 clock pulse. After the termination of this negative pulse, the potential at node N2 follows $\phi$4 potential to a high potential level if T1 is in a low conductivity state (corresponding to a "1" input during the first half of the clock cycle), or is forced back to the common terminal potential if T1 is in a high conductivity state (corresponding to a "0" input). Termination of the positive $\phi$3 pulse completes the first clock cycle and this potential remains stored at node N2 to become the input for the second stage of the shift register during the first half of the second clock cycle. As can be seen from the potential-time waveforms in FIG. 3, during the first half of the second clock cycle a high potential stored at node N2 results in a low potential at node N3, and a low potential stored at node N2 in a high potential stored at node N3 following the first half of the second clock cycle. During the second half of the second clock cycle a low potential stored at N3 (corresponding to a "1" input during $\phi$1 pulse of the first clock cycle) results in a high potential at node N4 following the full second clock cycle. A high potential stored at N3 (corresponding to a "0" input) results in a low stored potential at node N4 following the second clock cycle. This process continues for successive clock cycles until information is loaded into all two hundred stages of the shift register or in its energized portion depending on the input information format. The load period is terminated following the end of the positive $\phi$3 pulse and before the next positive $\phi$1 pulse.

During the shift register hold period positive and negative pulses are applied to its clock inputs $\phi$2, $\phi$3, $\phi$4 and $\phi$H as indicated in the top right portion of FIG. 3. Clock input $\phi$1 is held at zero with respect to the common terminal. The hold period starts with a positive $\phi$H pulse which renders transistor T5 conductive and thereby connects the first node of any shift register stage (node N3 for the second stage) to the common terminal through transistor T3. If a high potential had been stored at the second node of this stage (node N4 for the second stage) during the previous clock period, transistor T3 conducts and a low potential is restored at the first node (N3) during the first half of the hold period clock cycle. If a low potential had been stored at the second node (N4), transistor T3 does not conduct and a high potential is restored at the first node (N3) by the negative $\phi$2 pulse. As in the load period, during the second half of the clock cycle a low potential at the first node (N3) of a shift register stage results in a high stored potential at the second node of that stage (N4) and high potential at the first node (N3) in a low stored potential following the clock period at the second node of that stage (N4). Note that the states at any node in the shift register remain undisturbed during the holding period and the clock pulses only re-establish charge levels in the node capacitors. Operating in this mode, the shift register will retain information indefinitely. If the input information format requires bulk erasure of stored information preceding arrival of new serial information, the positive $\phi$H pulse is terminated in the middle of the negative $\phi$2 pulse during the last hold period clock cycle. Normal $\phi$3 and $\phi$4 clock phase pulses are retained in the last holding period clock cycle. This erases all shift register stages to the "0" or low brightness state during one clock cycle.

Excitation signal for the electroluminescent elements is applied between the terminals labeled Ext. for external and Rtn. for return in FIG. 2 during the hold and display period. A D.C. potential bias or a biased fraction of the electroluminescent excitation signal is applied between terminals Rtn. and Com. to provide the required operating bias for the control transistor T6. This bias as well as the amplitude of the excitation signal can be used to control the brightness of the bargraph display. In a practical display application with large electroluminescent elements it is necessary to synchronize the electroluminescent excitation signal with the clock waveforms to minimize required node capacitance values, transistor size, and power requirements for the dynamic shift register. This requirement results from the finite gate to drain capacitance of control transistor T6 and its ratio to node capacitor C1. Undesirable capacitive interaction between the excitation signal and the clock pulses in the shift register increase the pulse amplitude and therefore the power requirements. Detailed specifications for the excitation signal waveform as well as the clock frequency, amplitude, duty cycle and relative timing are associated with specific applications and input information formats.

The electroluminescent bargraph of the present invention is fabricated in a single pump down cycle of the vacuum system on a glass substrate. More specific details of the fabrication technique may be seen from "IEEE Transactions, Electron Devices-22", p. 739, (1975). Following circuit fabrication of the thin-film transistor shift register and the individual display element electrodes, the electroluminescent phosphor may be applied by chemical suspension spraying for the powdered phosphor, or by evaporation or sputter deposition for the thin-film phosphor and the associated dielectrics. An opaque black contrast enhancing film may be provided on the front or back of the glass substrate.

The entire device is compact, light, and dissipates less than a watt of power. A 200-element device allows 0.5% resolution and high legibility at high ambient brightness levels. The bargraph can be rapidly updated and has quick response. It can be easily programmed to display moving upper and lower limit levels. A flashing warning level can be provided. Because of the flexibility of the dynamic shift register any dynamic combination of lit or unlit bars can be shown.

Figure 4:
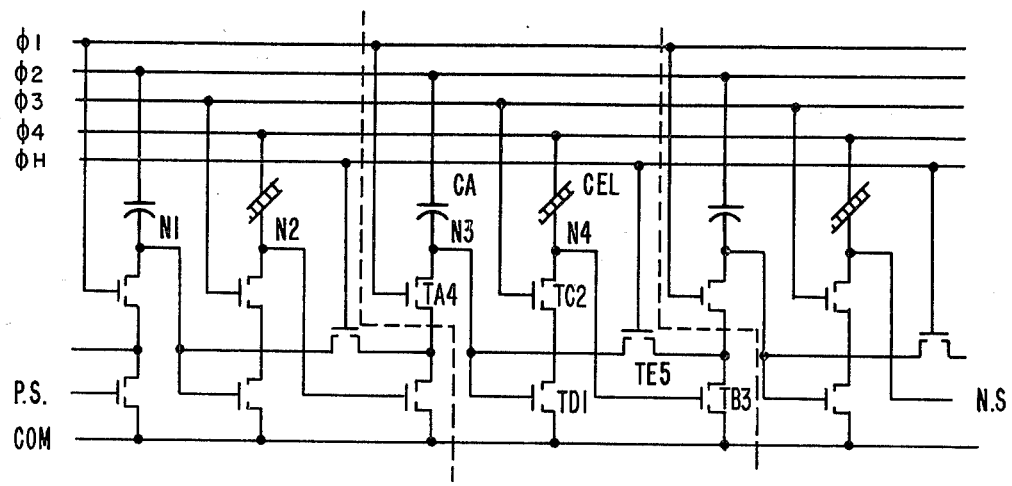
FIG. 4 is another embodiment circuit schematic display system wherein the electroluminescent display element is incorporated into the shift register and functions as a capacitive element in addition to its display function.
Figure 5:
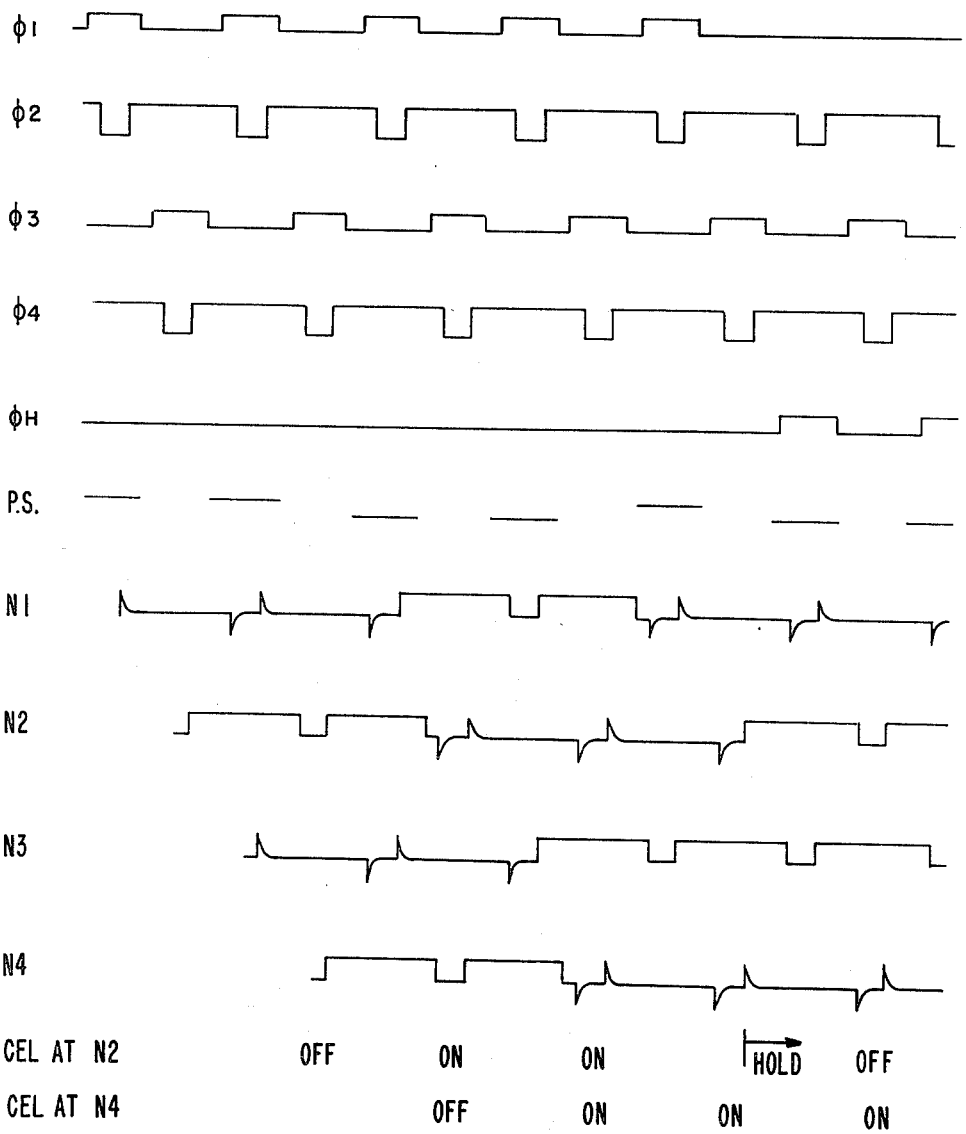
FIG. 5 is a plot of the operating waveforms associated with the circuit of FIG. 4.

In another embodiment of the present invention seen in the circuit schematic of FIG. 4 and exemplary operating waveforms of FIG. 5, three stages of the shift register are shown with the broken lines separating the stages. In this embodiment the electroluminescent display elements CEL are made an active part of the dynamic shift register. Since the display element has a characteristic capacitance resulting from its physical structure, it can be substituted for capacitor C1 and connected to node N4 and clock input $\phi 4$ in each stage of the shift register. The corresponding transistors to T1 through T4 are respectively TD1, TC2, TB3, TA4, with capacitors CA and CB corresponding to C2 and C1 in the FIG. 2 embodiment. The feedback transistor TE5 corresponds to transistor T5 and again as in the other embodiment permits holding the signal stationary at each stage when clock pulse $\phi H$ is applied instead of pulse $\phi 1$. This feedback or hold and refresh transistor connects together the first and second half stages of each stage. The operating waveform potentials seen in FIG. 5 correspond to those seen in the FIGS. 2 and 3 embodiment. As illustrated by the potential-time waveforms at the bottom of FIG. 5, the electroluminescent capacitor emits light when charged and discharged (last $\phi 4$ pulse at node N4), but does not when charge is retained (as at the last $\phi 4$ pulse at node N2). For this mode of operation the information in the shift register stages is held stationary while the $\phi 4$ clock pulses provide the excitation frequency required for the electroluminescent element. This is accomplished by holding $\phi 2$ and $\phi 3$ high and $\phi 1$ low. When the display period is longer than permitted by capacitive storage, the feedback transistor TE5 and clock pulse $\phi H$ activate a hold-refresh mode which permits unlimited storage time at each stage as indicated where $\phi H$ is substituted for $\phi 1$ in the last two clock periods in FIG. 5.

Figure 6:
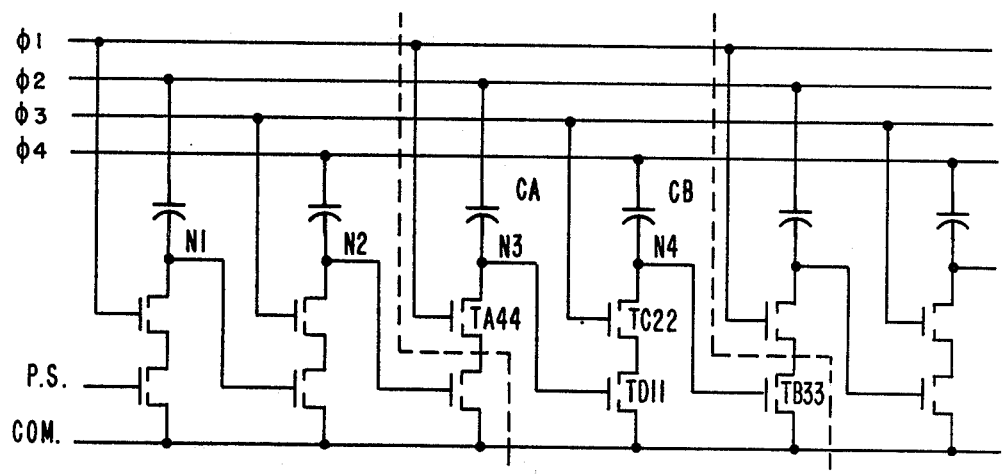
FIG. 6 is a circuit schematic of three stages of the dynamic shift register design used in the present invention.
Figure 7:
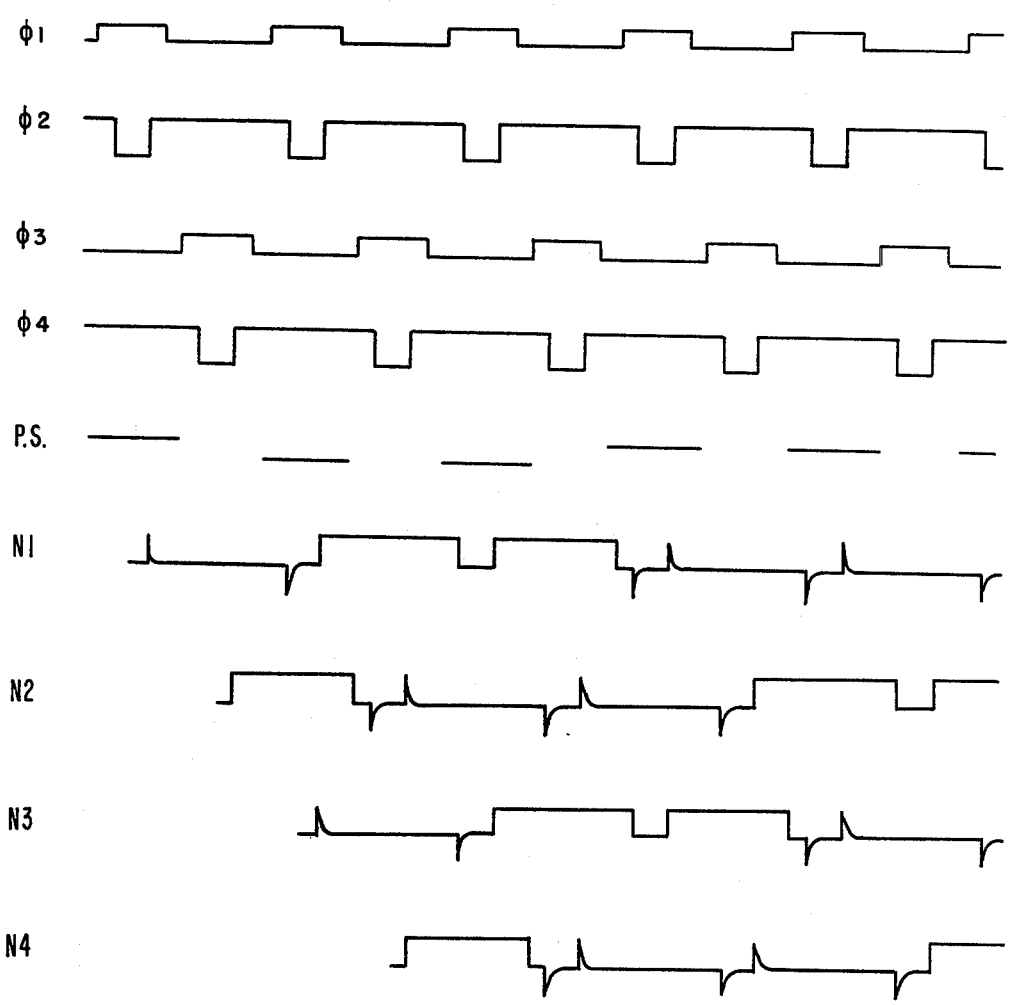
FIG. 7 is a plot of the operating waveforms associated with the circuit of FIG. 6.

The dynamic thin film transistor shift register per se is seen in the FIG. 6 circuit schematic, and the waveform diagrams of FIG. 7 which illustrate operation of the shift register. Again, three stages only are shown and are divided by the broken lines. The corresponding transistors to T1 through T4 are TD11, TC22, TB33, TA44, with capacitor CA corresponding to C2, and CB to C1 in the FIG. 2 embodiment. As can be seen from the potential time waveforms of FIG. 7, two of the four clock pulses $\phi 2$, $\phi 4$ are introduced through the node capacitors CA, CB, and their amplitudes determine the dynamic potential range of the register. At the leading edges of these negative pulses the node capacitors are pre-charged through the transistors, and at the trailing edges the node capacitors are conditionally discharged according to the potential preset at the previous node. As the information at the previous node has to be valid only at the time of the trailing edge, the waveforms of FIG. 7 are not unique but are used for illustration. Different clock overlaps can be used to provide desired circuit characteristics. The other two clock pulses $\phi 1$ and $\phi 3$, and the associated transistors provide isolation between the nodes, and the amplitudes of these pulses are lower; because all transistors in the circuit operate in the amplifier mode. This dynamic shift register circuit is readily fabricated with thin film circuit elements and permits serial digital input signals to be converted to parallel output signals.

We claim:

1. An electroluminescent bargraph comprising
    (a) an insulating elongated rectangular substrate;
    (b) an elongated rectangular array of a plurality of electroluminescent display elements disposed upon the substrate, which display elements comprise an individual display element electrode, a layer of electroluminescent phosphor, and a common light transmissive electrode extending over the area of the entire array;
    (c) a thin-film transistor multi-stage dynamic shift register addressing means disposed upon the substrate adjacent to and interconnected with the display elements, with the number of stages of the shift register equal to the number of display elements and an individual stage operatively connected to an individual display element, wherein each stage of the multi-stage dynamic shift register has a refresh-hold transistor interconnecting a first and second half stage, and each stage is connected to a switching transistor with the stage output connected to the gate of the switching transistor, and wherein one switching transistor contact is connected to an individual display element electrode of the display element and the other contact is connected to the display medium power supply, whereby the output signal of the shift register stage controls the actuation of the display element; and (d) drive signal input buses disposed at a peripheral side of the substrate connected to the shift register addressing means.

2. The electroluminescent bargraph set forth in claim 1, wherein respective outputs of the dynamic shift register stages are connected to the gate of a thin-film switching transistor, one contact of which is connected to an individual display element electrode and the other contact of which is connected to a power supply return bus, with the light transmissive common electrode connected to the power supply for driving the display elements.

3. The electroluminescent bargraph display device set forth in claim 1, wherein the dynamic shift register comprises a plurality of successive stages which accept a serial digital input signal and converts it to parallel output signals for each stage of the shift register, each stage of which is connected by a control transistor to the individual bar electrode of a display element.

4. The electroluminescent bargraph display device set forth in claim 1, wherein thin film insulated gate field effect transistors are utilized as switching and amplifying means in each stage of the shift register.

5. A dynamic shift register comprising a plurality of interconnected successive stages which accept a serial digital input signal and convert it to parallel output signals for each stage of the shift register, with each stage connected in parallel to clock means and each stage includes two potential node points at which complimentary signals are generated and stored, and wherein thin film insulated gate field effect transistors are utilized as switching means and amplifying means in the stages, and wherein each stage comprises a first input switching transistor one contact of which is fed the input signal and the gate of which is connected to the first phase lead of the clock means, the other contact of the input switching transistor is connected at a first node point between one side of a first capacitor and the gate of a second transistor one contact of which is connected to a common potential bus and the other contact of which is connected to one contact of a third transistor the gate of which is connected to the third phase lead of the clock means, and the other contact of the third transistor is connected at a second node point to one side of a second capacitor and the gate of a fourth transistor one contact of which is connected to the common potential bus and the other contact of the fourth transistor is connected to the input of the succeeding stage, with the other sides of the first and second capacitors connected respectively to the second and fourth phase leads of the clock means.

6. An electroluminescent bargraph comprising (a) an insulating elongated rectangular substrate;

(b) an elongated rectangular array of a plurality of electroluminescent display elements disposed upon the substrate, which display elements comprise an individual display element electrode, a layer of electroluminescent phosphor, and a common light transmissive electrode extending over the area of the entire array;

(c) a thin-film transistor multi-stage dynamic shift register addressing means disposed upon the substrate adjacent to and interconnected with the display elements, with the number of stages of the shift register equal to the number of display elements and an individual stage operatively connected to an individual display element and wherein each stage of the dynamic shift register is connected in parallel to clock means, with each stage comprising a first input switching transistor one contact of which is fed the input signal and the gate of which is connected to the first phase lead of the clock means, the other contact of the input switching transistor is connected at a first node point between one side of a first capacitor and the gate of a second transistor one contact of which is connected to a common potential bus and the other contact of which is connected to one contact of a third transistor the gate of which is connected to the third phase lead of the clock means, and the other contact of the third transistor is connected at a second node point to one side of a second capacitor and the gate of a fourth transistor one contact of which is connected to the common potential bus and the other contact of the fourth transistor is connected to the input of the succeeding stage and also to one contact of a fifth transistor the other contact of which is connected to the first node point, with the gate of the fifth transistor connected to the clock means which supplies a hold actuation pulse, and wherein the other sides of the first and second capacitors are connected respectively to the second and fourth phase leads of the clock means;

(d) drive signal input buses disposed at a peripheral side of the substrate connected to the shift register addressing means.

* * * * *